United States Patent
Hallin et al.

(10) Patent No.: US 11,126,215 B2
(45) Date of Patent: Sep. 21, 2021

(54) CLOCK SIGNAL POLARITY CONTROLLING CIRCUIT

(71) Applicant: Telefonaktiebolaget LM Ericsson (publ), Stockholm (SE)

(72) Inventors: Joakim Hallin, Askim (SE); Olov Haapalahti, Solna (SE)

(73) Assignee: Telefonaktiebolaget LM Ericsson (publ), Stockholm (SE)

( * ) Notice: Subject to any disclaimer, the term of this patent is extended or adjusted under 35 U.S.C. 154(b) by 0 days.

(21) Appl. No.: 16/954,195

(22) PCT Filed: Dec. 18, 2017

(86) PCT No.: PCT/SE2017/051290
§ 371 (c)(1),
(2) Date: Jun. 15, 2020

(87) PCT Pub. No.: WO2019/125236
PCT Pub. Date: Jun. 27, 2019

(65) Prior Publication Data
US 2021/0165440 A1     Jun. 3, 2021

(51) Int. Cl.
*G06F 1/04* (2006.01)
*H03K 3/037* (2006.01)
*H03K 19/21* (2006.01)

(52) U.S. Cl.
CPC ............ *G06F 1/04* (2013.01); *H03K 3/037* (2013.01); *H03K 19/21* (2013.01)

(58) Field of Classification Search
CPC ..... G06F 1/04; G06F 1/06; G06F 1/08; G06F 1/14; G06F 7/607; G06F 7/62;
(Continued)

(56) References Cited

U.S. PATENT DOCUMENTS

| | | | | | |
|---|---|---|---|---|---|
| 5,083,049 A | * | 1/1992 | Kagey | ................... | G01R 31/30 327/141 |
| 5,327,019 A | * | 7/1994 | Kluck | ................... | H03K 3/037 326/52 |

(Continued)

FOREIGN PATENT DOCUMENTS

| JP | H01286609 A | 11/1989 |
|---|---|---|
| WO | 2016202368 A1 | 12/2016 |

OTHER PUBLICATIONS

Invitation to Pay Additional Fees for International Application No. PCT/SE2017/051290, dated Sep. 10, 2018, 12 pages.
(Continued)

*Primary Examiner* — Hai L Nguyen
(74) *Attorney, Agent, or Firm* — Nicholson De Vos Webster & Elliott LLP

(57) ABSTRACT

A clock signal polarity controlling circuit comprises a first latch comprising a clock input, a data input and an output. The data input is coupled to an output of a clock signal generator, the clock input is coupled to a reference clock signal. The clock signal polarity controlling circuit further comprises a second latch comprising a clock input, a data input and an output. The data input is coupled to the output of the first latch, the clock input is coupled to the reference clock signal. The circuit further comprises an XOR circuit comprising a first and second inputs and an output. The first and second inputs are coupled to the output of the second latch and the output of the clock signal generator respectively, and a clock signal having a polarity controlled by the reference clock signal is generated at the output of the XOR circuit.

16 Claims, 13 Drawing Sheets

(58) Field of Classification Search
CPC ...... H03K 19/21; H03K 3/037; H03K 3/0372; H03K 3/356; H03K 3/356034; H03K 21/026; H03K 21/10; H03K 21/12
See application file for complete search history.

(56) References Cited

U.S. PATENT DOCUMENTS

| | | | | |
|---|---|---|---|---|
| 5,917,356 | A * | 6/1999 | Casal | H03L 7/0816 327/236 |
| 6,034,554 | A * | 3/2000 | Francis | H03D 13/004 327/12 |
| 6,956,923 | B1 * | 10/2005 | Younis | H03D 13/003 327/159 |
| 7,386,084 | B2 * | 6/2008 | Yin | H03K 5/135 327/159 |
| 7,420,391 | B2 * | 9/2008 | Pesci | H03K 5/1534 326/46 |
| 2007/0146033 | A1 | 6/2007 | Pesci | |
| 2008/0211559 | A1 | 9/2008 | Tanaka | |
| 2010/0134154 | A1 * | 6/2010 | He | H03K 23/542 327/115 |
| 2016/0233867 | A1 | 8/2016 | Tamura | |

OTHER PUBLICATIONS

International Search Report and Written Opinion for International Application No. PCT/SE2017/051290, dated Sep. 28, 2018, 19 pages.
Decision to Grant, EP App. No. 17823241.9, dated Feb. 11, 2021, 2 pages.
Intention to Grant, EP App. No. 17823241.9, dated Nov. 3, 2020, 61 pages.
International Preliminary Report on Patentability, PCT App. No. PCT/SE2017/051290, dated Jul. 2, 2020, 14 pages.

* cited by examiner

CLOCK SIGNAL POLARITY CONTROLLING CIRCUIT

CROSS-REFERENCE TO RELATED APPLICATIONS

This application is a National stage of International Application No. PCT/SE2017/051290, filed Dec. 18, 2017, which is hereby incorporated by reference.

TECHNICAL FIELD

Embodiments herein relate to controlling a polarity of a clock signal. In particular, the embodiments herein relate to clock signal polarity controlling circuits, as well as quadrature clock signal generating circuits and electronic circuits comprising the clock signal polarity controlling circuits and the quadrature clock signal generating circuits.

BACKGROUND

Wireless communication systems usually comprise complex chains of transmitter and receiver circuits, including several frequency conversion steps. The transmitter circuits typically up-convert baseband signals to Radio Frequency (RF) signals for transmission, and the receiver circuits down-convert received RF signals to baseband signals for processing. Such frequency conversion requires mixers to mix two frequency signals. The mixers performing the frequency conversion require clock signals. Some of these mixers also utilize image rejection and are referred as IQ-mixers. These IQ-mixers require two clock signals, IQ clock signals, i.e. one In-phase clock signal and one Quadrature-phase clock signal, at the same frequency with a precise 90 degree phase shift in between.

A common method to generate the IQ clock signals is to use a passive polyphase network. However if a clock signal of twice the required frequency is already available in a system, a convenient solution is to use a frequency divider that, by its design, automatically generates 90 degree phase shifted output signals.

A latched based frequency divider is well suited for IQ clock signals generation. However, an output signal polarity of the latch based frequency divider is set at start-up and may be either 0 degrees or 180 degrees. So the output signal polarity from the latch based frequency divider is totally unknown. The only reference to the latch based frequency divider is a frequency of an input clock signal, which is at twice of the output signal frequency. Thus it does not contain any polarity information that the divided signal may relate to. This may not be a problem for some electronic systems, but may cause serious problems in some electronic systems, when several frequency dividers are used and output signals from them are combined. Even if the output clock signals from the frequency dividers are often not directly combined but after passing through a number of frequency translation circuits, still phase correlation between the clock signals is crucial for proper system operation.

The need for knowing and correcting the clock signal polarity is increasing with more advanced antenna systems and is crucial in beamforming and Multiple-Input-Multiple-Output (MIMO) systems where several integrated circuits often are used to feed an array of antennas.

SUMMARY

Therefore, it is an object of embodiments herein to provide a technique for controlling a polarity of a clock signal generated from a clock signal generator.

According to one aspect of embodiments herein, the object is achieved by a clock signal polarity controlling circuit. The clock signal polarity controlling circuit comprises a first latch comprising a clock input, a data input and an output, the data input is coupled to an output of a clock signal generator, the clock input is coupled to a reference clock signal.

The clock signal polarity controlling circuit further comprises a second latch comprising a clock input, a data input and an output, the data input is coupled to the output of the first latch, the clock input is coupled to an inverted reference clock signal.

The clock signal polarity controlling circuit further comprises an XOR circuit comprising a first and second inputs and an output, the first and second inputs are coupled to the output of the second latch and the output of the clock signal generator respectively, and a clock signal having a polarity controlled by the reference clock signal is generated at the output of the XOR circuit.

According to another aspect of embodiments herein, the object is achieved by a clock signal polarity controlling circuit.

The clock signal polarity controlling circuit comprises a first latch comprising a clock input, a data input and an output, the data input is coupled to an output of a clock signal generator, the clock input is coupled to a reference clock signal.

The clock signal polarity controlling circuit further comprises a second latch comprising a clock input, a data input and an output, the data input is coupled to an inverted output of the clock signal generator, the clock input is coupled to an inverted reference clock signal.

The clock signal polarity controlling circuit further comprises an XOR circuit comprising a first and second inputs and an output, wherein the first and second inputs are coupled to the outputs of the first and second latches respectively, and a clock signal having a polarity controlled by the reference clock signal is generated at the output of the XOR circuit.

According to the embodiments described above, the output signal polarity of a clock signal generator, e.g. a frequency divider, is compared to a reference clock signal. The frequency of the reference clock signal may be half of the clock signal generator output signal frequency, or lower, such as ½, ¼, ⅛ etc. or generally may be $1/(2^n)$, where $n \geq 1$. In this way, if a reference clock signal with a known or desired polarity is applied to the clock signal polarity controlling circuit, it will generate a clock signal having a polarity controlled by the reference clock signal. That is a clock signal having either a same or an opposite logic level as the reference clock signal at sampling instants is generated. In other words, the polarity of a clock signal generated from a clock signal generator is well under control.

Further, for the first embodiment, it may generate a DC signal that may be analyzed by system software, which may then take proper action to change the polarity of the clock signal. The DC signal may also be used to directly invert the polarity of the clock signal if necessary.

For the second embodiment, the polarity of the clock signal may be inverted directly if needed without generating a DC signal.

Electronic devices or systems which depend on phase relation between two or more clock signals generated by frequency division may require the functionality and technique of the embodiments herein.

Thus, embodiments herein provide a technique for controlling a polarity of a clock signal generated from a clock signal generator.

BRIEF DESCRIPTION OF THE DRAWINGS

Examples of embodiments herein are described in more detail with reference to attached drawings in which.

DETAILED DESCRIPTION

The technique according to embodiments herein for controlling a polarity of a clock signal generated from a clock signal generator is to compare the phase, or rather polarity, of the clock signal, e.g. a divided signal from a frequency divider, with a reference clock signal of known polarity. This may be performed with two clocked latches, e.g. D-type latches, and an XOR block.

Figure 1:
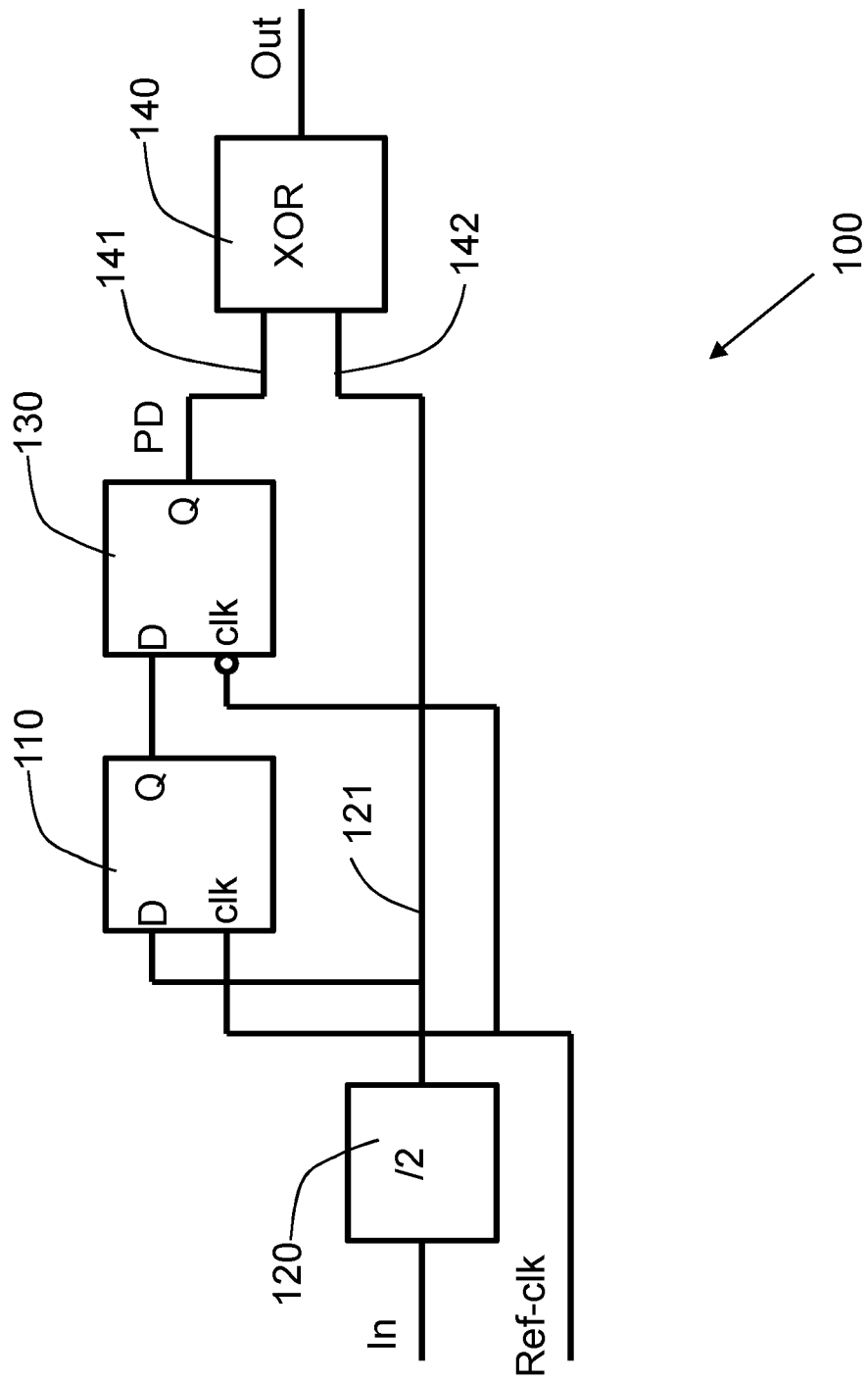
FIG. 1 is a general block view of a clock signal polarity controlling circuit according to one embodiment herein.

The two latches and the XOR may be connected in different ways to form a clock signal polarity controlling circuit. FIG. 1 illustrating one example embodiment of a clock signal polarity controlling circuit 100.

The clock signal polarity controlling circuit 100 comprises a first latch 110 comprising a clock input clk, a data input D and an output Q, wherein the data input D is coupled to an output 121 of a clock signal generator 120, shown as a divide by 2 circuit, the clock input clk is coupled to a reference clock signal Ref-clk.

The clock signal polarity controlling circuit 100 further comprises a second latch 130 comprising a clock input clk, a data input D and an output Q, wherein the data input D is coupled to the output Q of the first latch 110. The small circle shown at the clock input clk of the second latch 130 represents that it should receive an inverted reference clock signal Ref-clk. So the clock input clk is coupled to the inverted reference clock signal Ref-clk, or to the reference clock signal Ref-clk via an inverter.

The clock signal polarity controlling circuit 100 further comprises an XOR circuit 140 comprising a first input 141 and a second input 142 and an output Out. The first and second inputs 141, 142 are coupled to the output Q of the second latch 130 and the output 121 of the clock signal generator 120 respectively.

A clock signal having a polarity controlled by the reference clock signal is generated at the output Out of the XOR circuit 140.

An output logic signal PD may be generated at the output of the second latch 130 which indicates the polarity of the clock signal from the clock signal generator 120 with relation to the reference clock signal Ref-clk. The PD signal may then be used, directly or via software, to invert the polarity of the clock signal at the output of the XOR circuit, if needed.

Figure 2A:
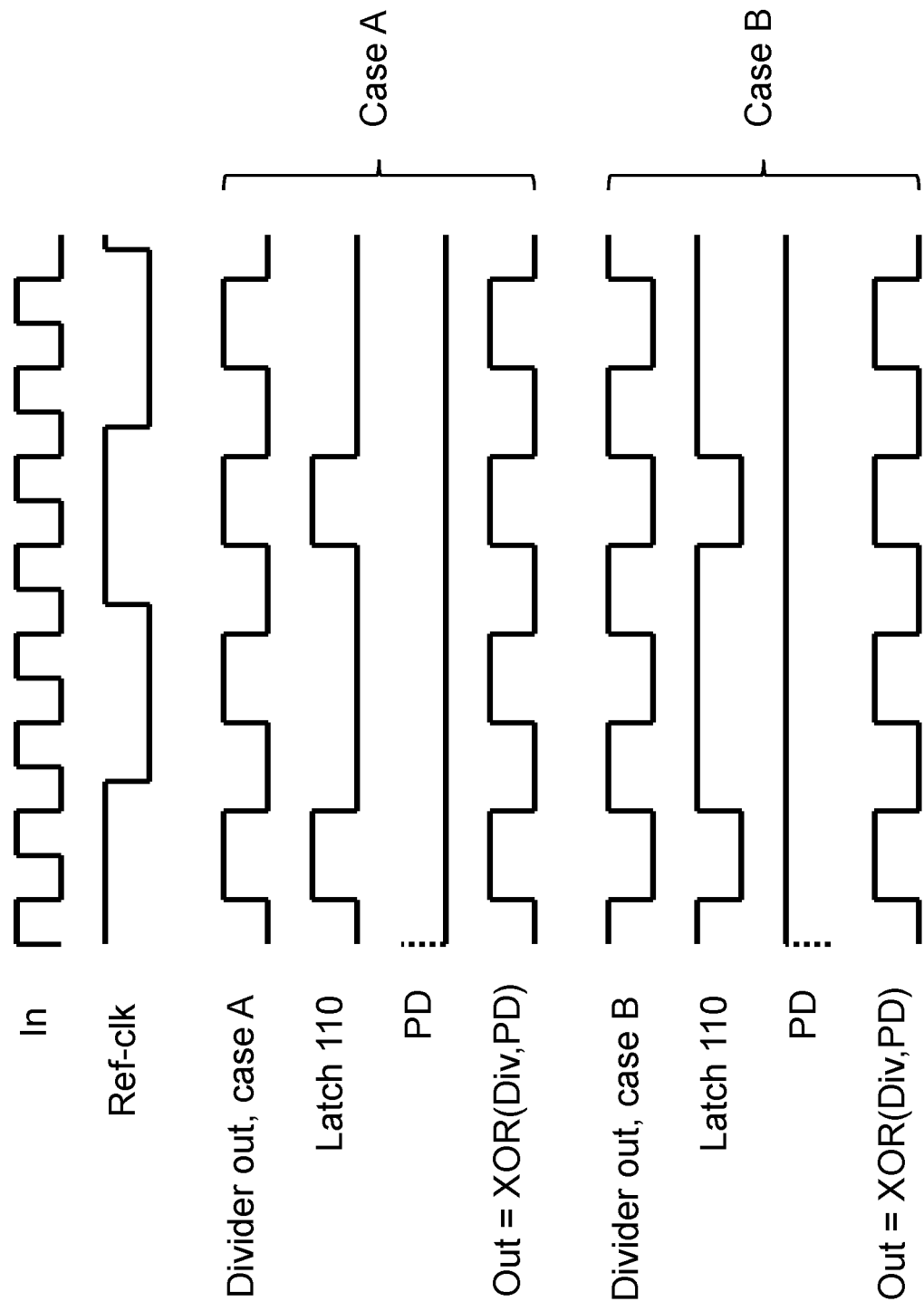
FIGS. 2a and 2b are diagrams illustrating the responses of the clock signal polarity controlling circuit in FIG. 1 for different reference clock frequencies.
Figure 2B:
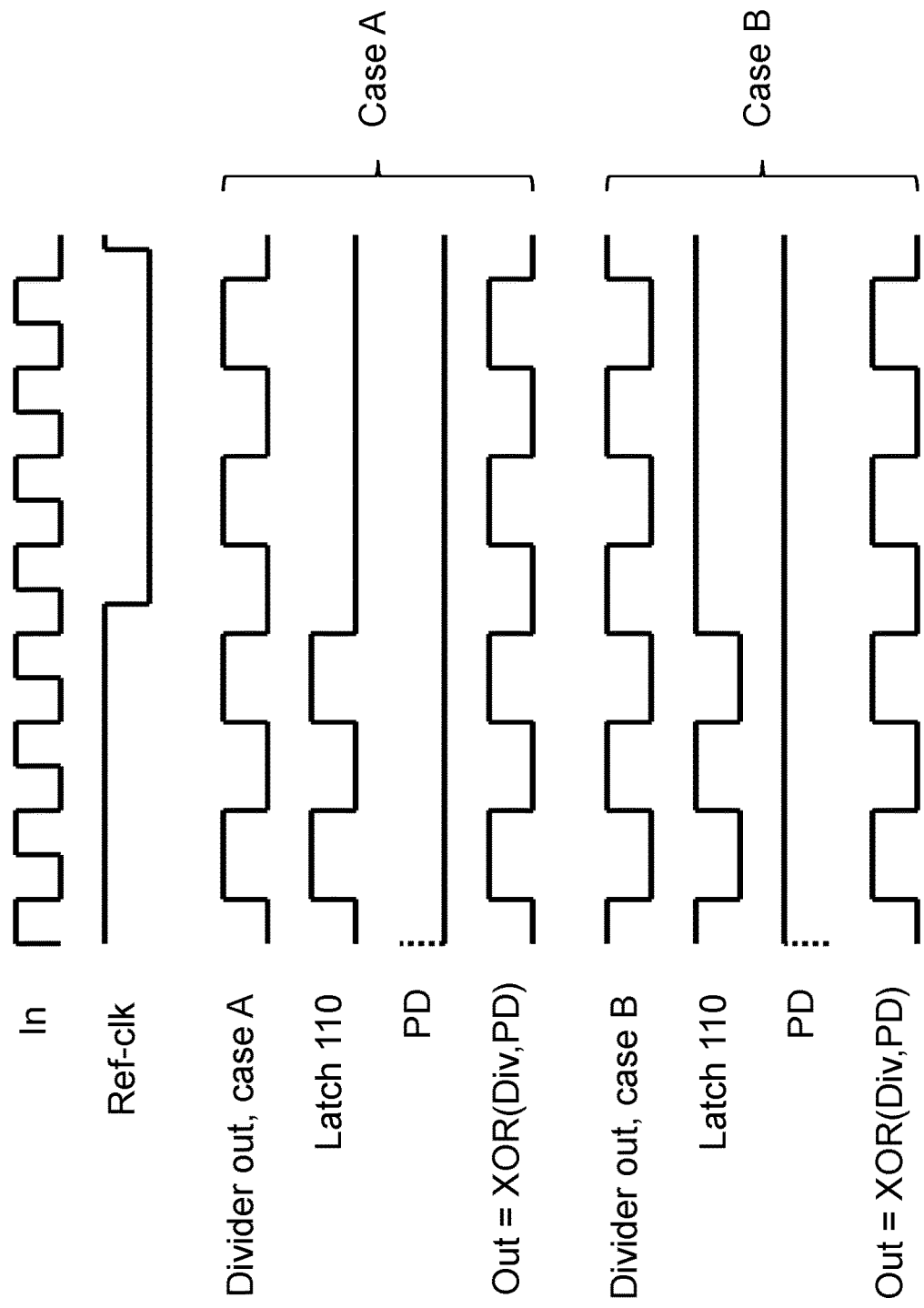

The frequency of the reference clock signal Ref-clk may be half of or lower than the frequency of the clock signal 121, i.e. the divide by 2 circuit output signal, such as ½, ¼, ⅛ etc. or generally may be $1/(2^n)$, where $n \geq 1$. FIGS. 2a and 2b show responses of the clock signal polarity controlling circuit 100 in FIG. 1 for different reference clock signal frequencies with different scenarios. In FIG. 2a, the frequency of the reference clock signal Ref-clk is half of the divide by 2 circuit output signal frequency, and in FIG. 2b, the frequency of the reference clock signal Ref-clk is a quarter of the divide by 2 circuit output signal frequency.

Before we discuss the different scenarios in FIGS. 2a and 2b, let's define a polarity of any given signal with respect to the reference clock signal as follows:

Assume the signal is sampled at sampling instants, e.g. at the positive edge of the reference clock signal, i.e. at a logic level of low to a logic level of high transition:

If the sampled output of the signal is logic high, we define the two signals to be in-phase or have the same polarity;

If the sampled output of the signal is logic low, we define the two signals to be out-of-phase or have anti-polarity.

Of course, similar definitions may be made using the negative edge of the reference clock signal.

In both FIGS. 2a and 2b, for case A, where the clock signal 121, indicated by "Divider out, case A", is out-of-phase with the reference clock signal "Ref-clk" or is anti-polarity with respect to the reference clock signal "Ref-clk", the output from the first latch is indicated by "Latch 110", the output from the second latch 130 is indicated by "PD". It can be seen that the output "PD" is logic low, an XOR operation on the output of the signal generator "Divider out, case A" and the signal "PD" will give an output clock signal out-of-phase with the reference clock signal "Ref-clk" or anti-polarity with respect to the reference clock signal Ref-clk, shown by "Out=XOR(Div,PD)", and in this case, the polarity of the clock signal is the same as it is.

For case B, where the clock signal 121, indicated by "Divider out, case B", is in-phase with the reference clock signal "Ref-clk", or has the same polarity as the reference clock signal "Ref-clk", the output from the first latch 110 is shown by "Latch 110", the output from the second latch 130 is shown by "PD". It can be seen that the output "PD" is logic high, an XOR operation on the output of the signal generator "Divider out, case B" and the signal "PD" will give an output clock signal out-of-phase with the reference clock signal "Ref-clk" or has an anti-polarity with respect to the reference clock signal, i.e. the polarity of the clock signal 121 is inverted, shown by "Out=XOR (Div, PD)".

Figure 3:
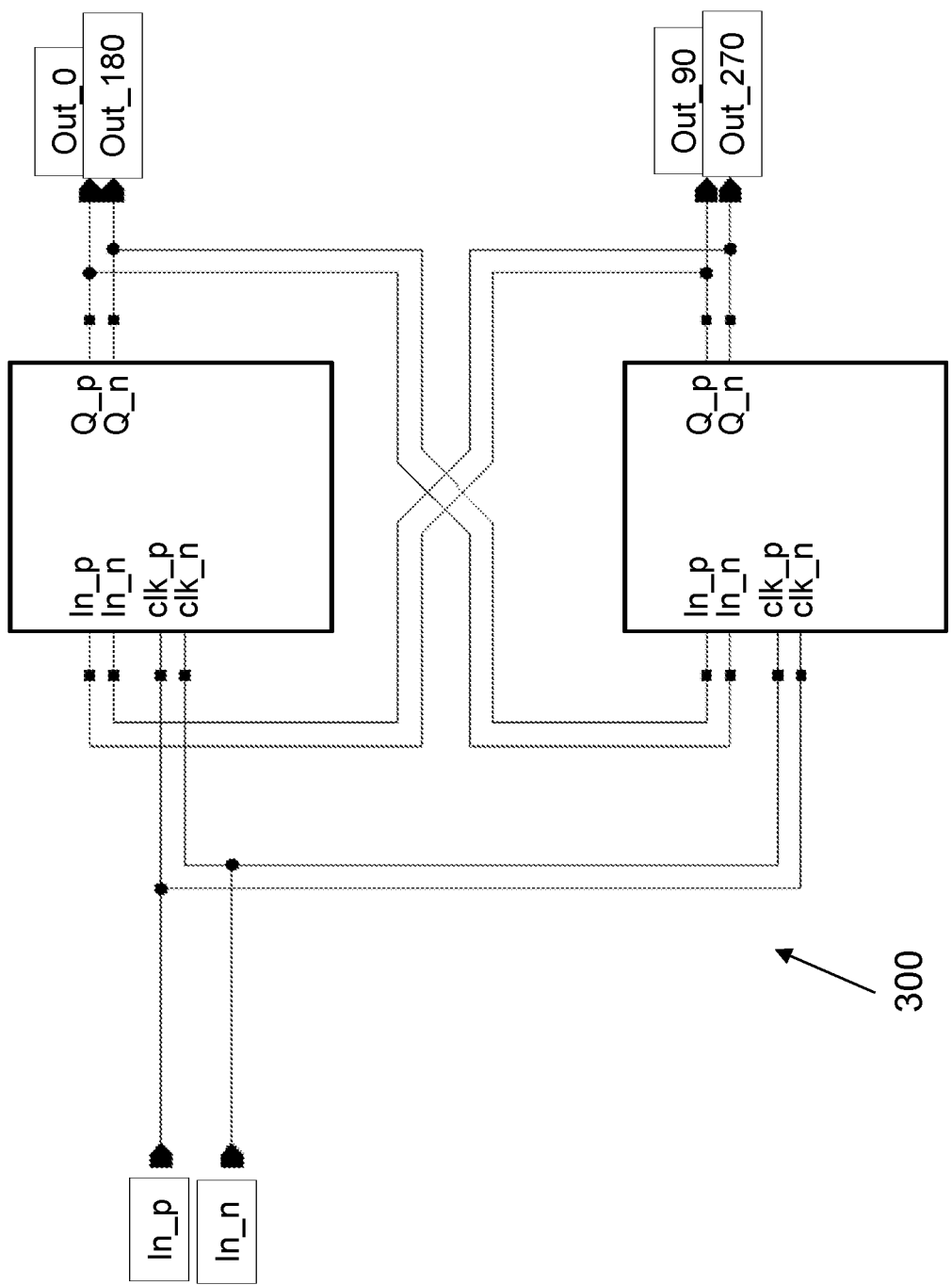
FIG. 3 is a block view of a quadrature clock signal generator.

Therefore, according to some embodiments herein, a clock signal having an anti-polarity with respect to the reference clock signal, or with an opposite logic level as the reference clock signal at sampling instants, may be generated at the output of the XOR circuit. The clock signal polarity controlling circuit 100 may be used in an IQ-clock signal generator. FIG. 3 shows a typical latch based divide by two circuits for IQ clock signal generation. The quadrature clock signal generator 300 shown in FIG. 3 has an in-phase output, I-output, refers to Out_0, and a quadrature-output, Q-output, refers to Out_90. Further, both in-phase and quadrature outputs are differential outputs, i.e. the two in-phase outputs, Out_0 and Out_180 have 180 degree phase difference as well as the two quadrature-outputs, Out_90, Out_270.

Figure 4:
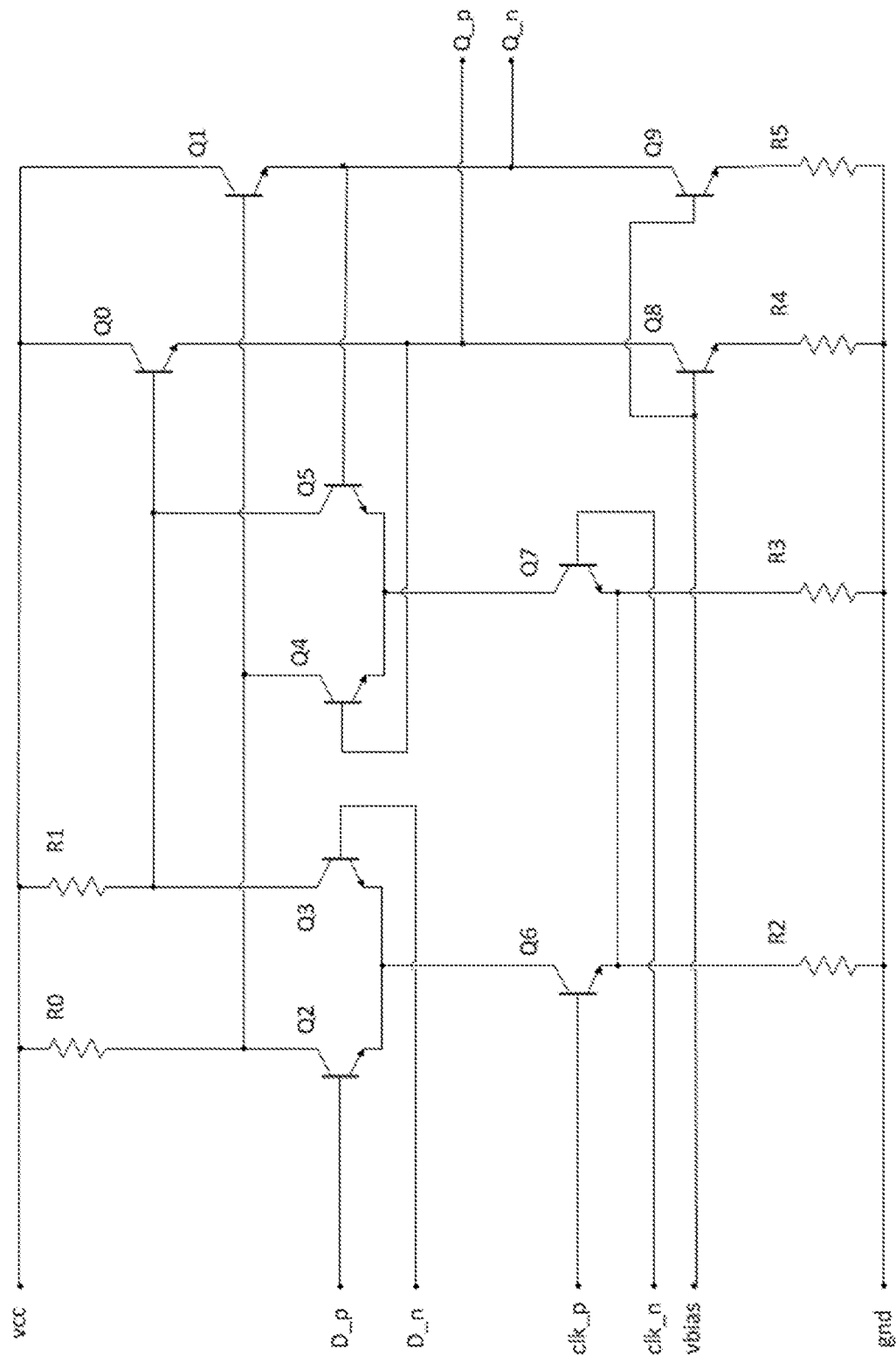
FIG. 4 is a schematic view of an example embodiment of a D-latch implemented by bipolar transistors.

FIG. 4 shows an example differential D-latch implemented by bipolar transistors. This D-latch may be used as the latches in the quadrature clock signal generator 300.

According to some embodiments herein, the first and second latches 110, 130 in the clock signal polarity controlling circuit 100 may be differential latches and may be implemented by the D-latch shown in FIG. 4.

Figure 5:
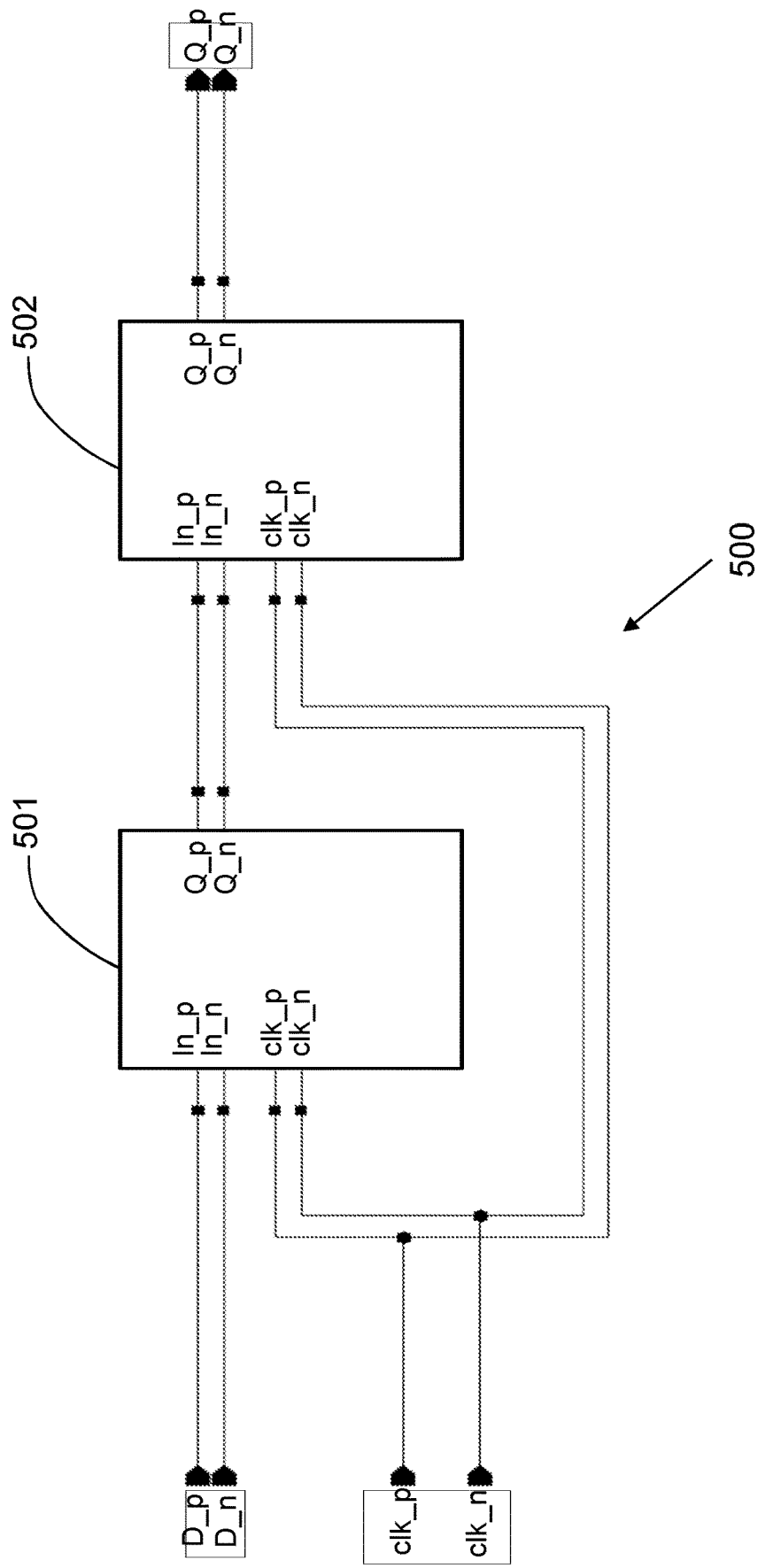
FIG. 5 is a flip-flop implemented by two differential latches according to embodiments herein.

FIG. 5 shows how the first and second differential latches in the clock signal polarity controlling circuit 100 are connected. The two differential latches 501, 502 are connected to form a flip-flop 500. That is the positive clock input clk_p of the first latch 501 is connected to the negative clock input clk_n of the second latche 502, and the negative clock input clk_n of the first latch 501 is connected to the positive clock input of the second latch 502. The differential output Q_p/Q_n of the first latch 501 is connected to the differential data input D_p/D_n of the second latch 502.

To controlling the polarity of the differential IQ clock signals output from the quadrature clock signal generator 300, a differential clock signal polarity controlling circuit 300 may be coupled to one of the I- or Q-output, i.e. either I-output or Q-output.

Figure 6:
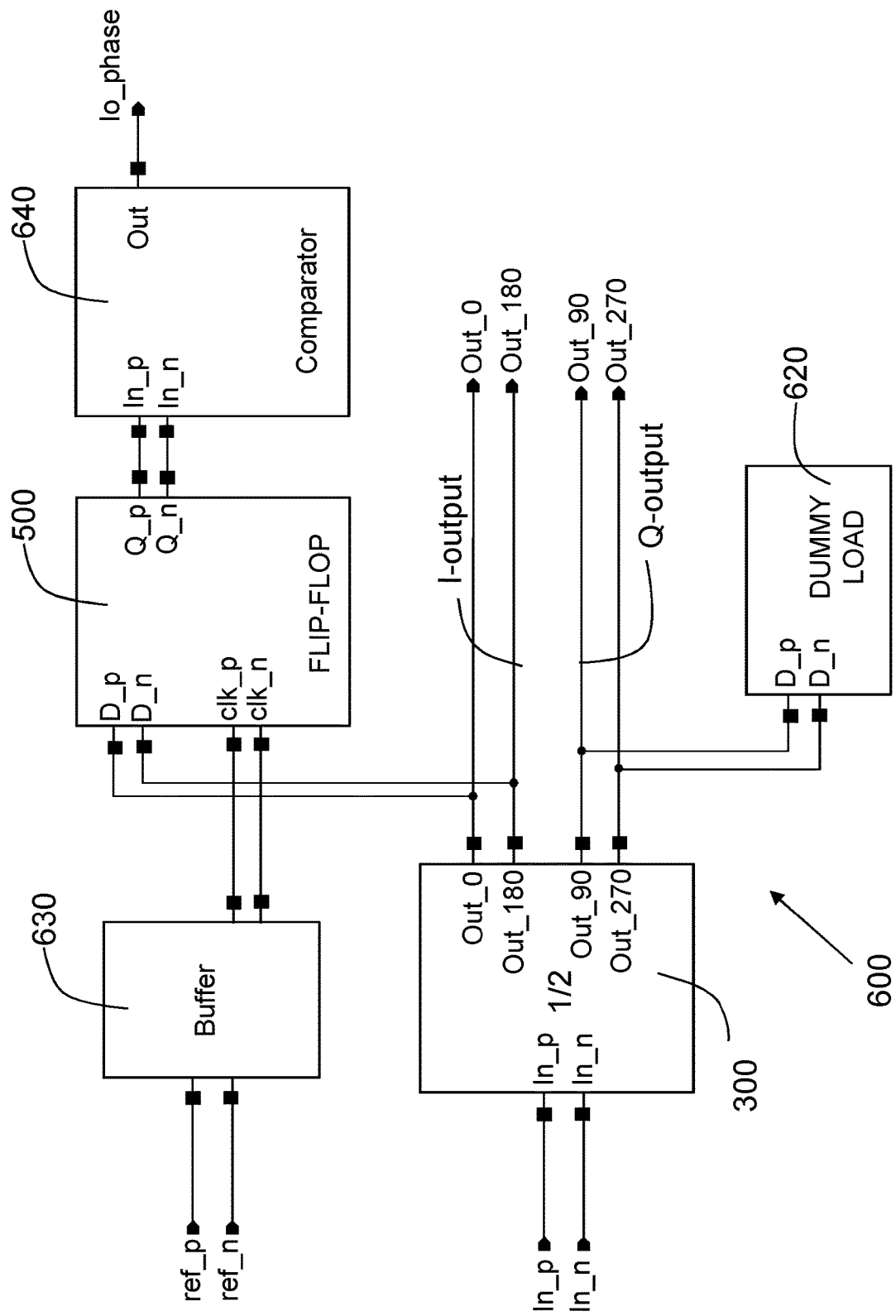
FIG. 6 is a block view of a quadrature clock signal generating circuit with clock signal polarity controlling circuit according to embodiments herein.

FIG. 6 shows a quadrature clock signal generating circuit 600. The quadrature clock signal generating circuit 600 comprises the quadrature clock signal generator 300 and a clock signal polarity controlling circuit shown by the flip-flop 500 only. In FIG. 6 the clock signal polarity controlling circuit differ from that shown in FIG. 1 by not depicting XOR. The flip-flop 500 may be connected to one of the I or Q-output, e.g. connected to the I-output of the quadrature clock signal generator 300. A dummy load 620 is added to the Q-output of the clock signal generator 300, i.e. the 90 degree output, to minimize phase error.

The quadrature clock signal generating circuit 600 may further comprise a comparator 640 to convert a differential output of the second latch 502 in the flip-flop 500 to a single ended low pass filtered signal. The single ended low pass filtered signal may be used for indicating and/or controlling the polarity of the IQ-clock signals.

The quadrature clock signal generating circuit 600 may further comprise a buffer 630, the clock inputs clk_p/clk_n of the first and second latches in the flip-flop 500 are coupled to the reference clock signal through the buffer 630 to ensure proper clocking of the flip-flop 500.

Figure 7:
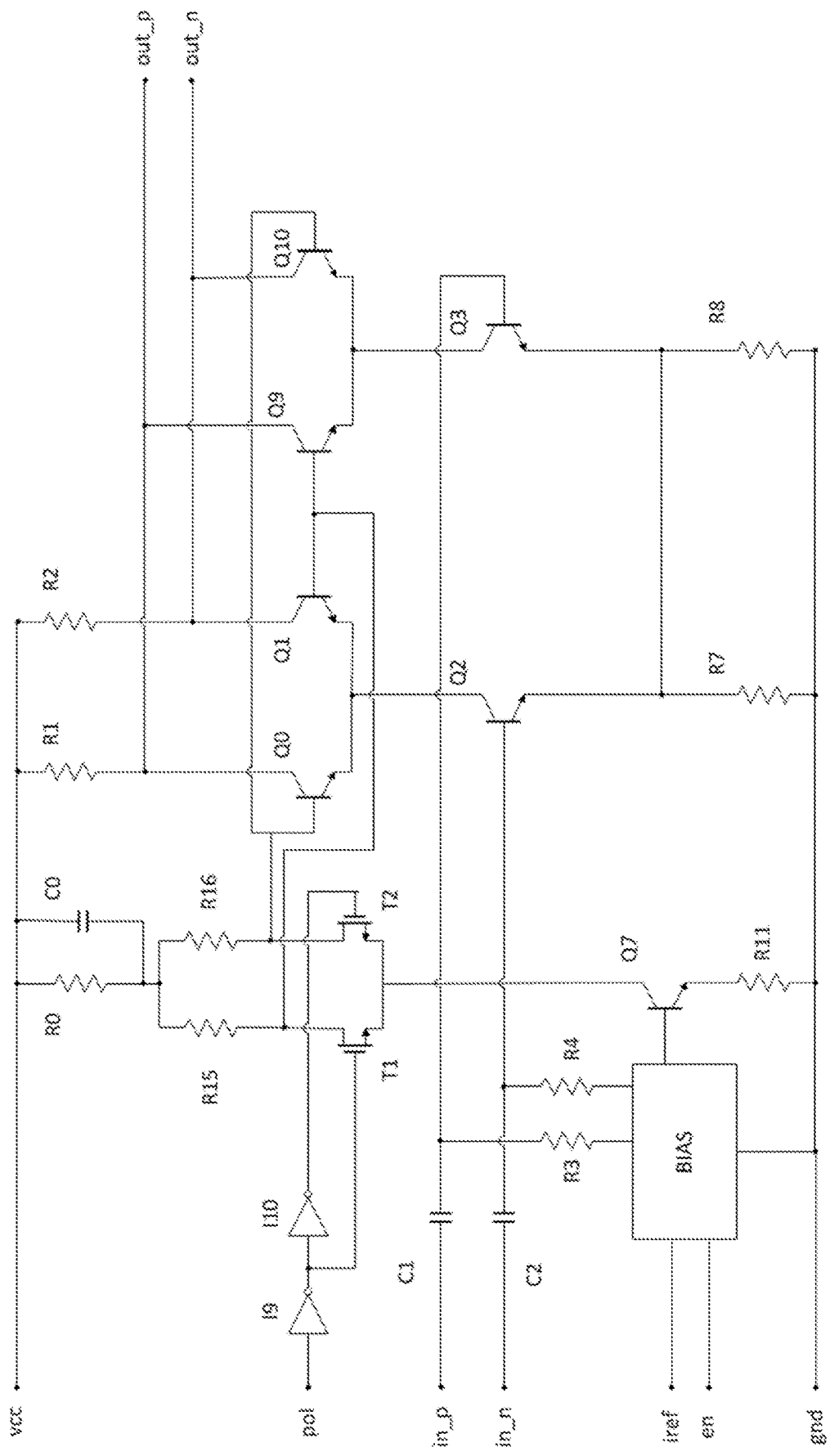
FIG. 7 is a schematic view of an LO-driver with XOR functionality.

The XOR circuit in the clock signal polarity controlling circuit 100 may be implemented as an LO-driver with a polarity switch. FIG. 7 shows an example LO-driver 700 implemented by bipolar transistors. The LO-driver 700 may perform the XOR functionality by inverting the output polarity with the "pol" input. For the quadrature clock signal generating circuit 600, two LO-drivers 700 are needed. The inputs of two LO drivers may be connected to the IQ-outputs, i.e. out_0/out_180 and out_90/out_270, of the quadrature clock signal generating circuit 600. The 'pol' inputs of the two drivers are both connected to the output of the comparator 640, i.e. the single ended low pass filtered signal lo_phase.

Figure 8:
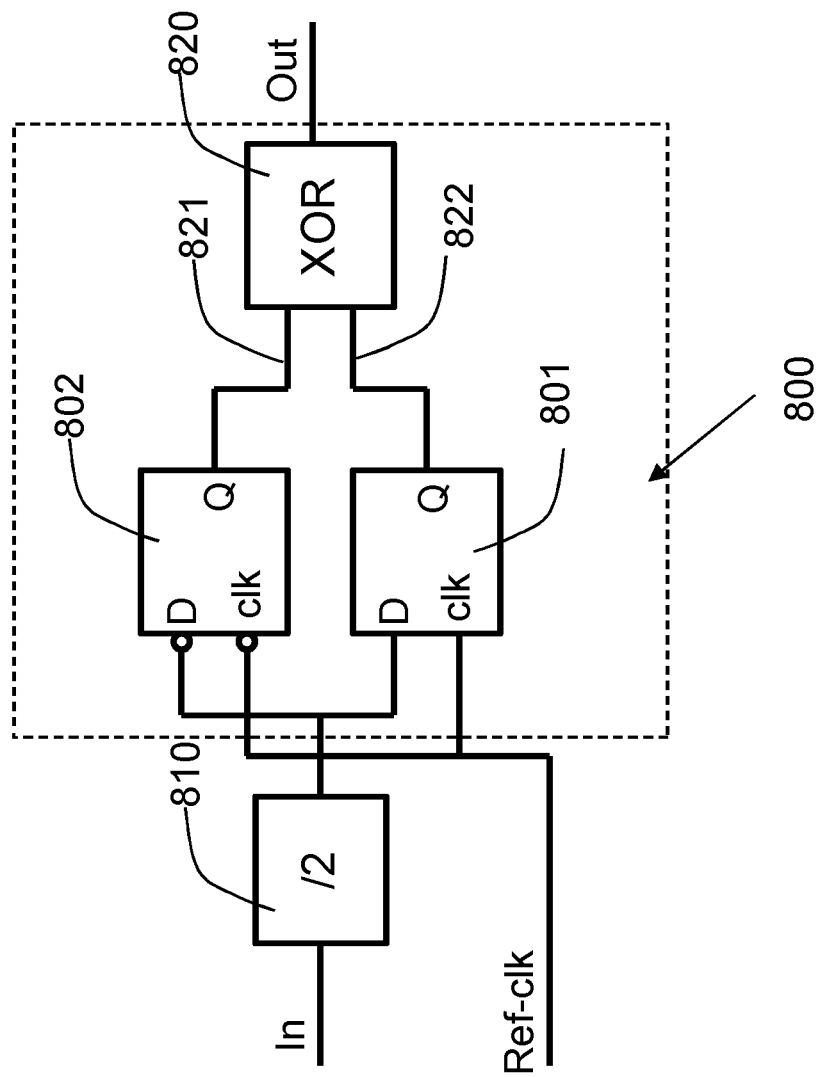
FIG. 8 is a general block view of a clock signal polarity controlling circuit according to one embodiment herein.

FIG. 8 shows a clock signal polarity controlling circuit 800 according to some embodiments herein. The clock signal polarity controlling circuit 800 comprises a first latch 801 comprising a clock input clk, a data input D and an output Q. The data input D is coupled to an output of a clock signal generator 810, e.g. a divide by 2 circuit, the clock input clk is coupled to a reference clock signal Ref-clk.

The clock signal polarity controlling circuit 800 further comprises a second latch 802 comprising a clock input clk, a data input D and an output Q. The small circle shown at the clock input clk and data input D of the second latch 802 represents that they should receive an inverted reference clock signal Ref-clk and an inverted data signal respectively, compared to the clock input clk and data input D of the first latch 801. So the data input D is coupled to the inverted output of the clock signal generator 810, or to the output of the clock signal generator 810 via an inverter, the clock input clk is coupled to the inverted reference clock signal Ref-clk, or to the reference clock signal Ref-clk via an inverter.

The first and second latches 801, 802 are thus connected in parallel with the clock and data inputs inverted on one of them.

The clock signal polarity controlling circuit 800 further comprises an XOR circuit 820 comprising a first and second inputs 821, 822 and an output Out, wherein the first and second inputs 821, 822 are coupled to the outputs of the first and second latches 801, 802 respectively. A clock signal having a polarity controlled by the reference clock signal Ref-clk is generated at the output of the XOR circuit 820.

According to some embodiments herein, the first and second latches 801, 802 in the clock signal polarity controlling circuit 800 may be differential latches, and the XOR 820 may be a symmetrical XOR with differential inputs and differential outputs.

Figure 9A:
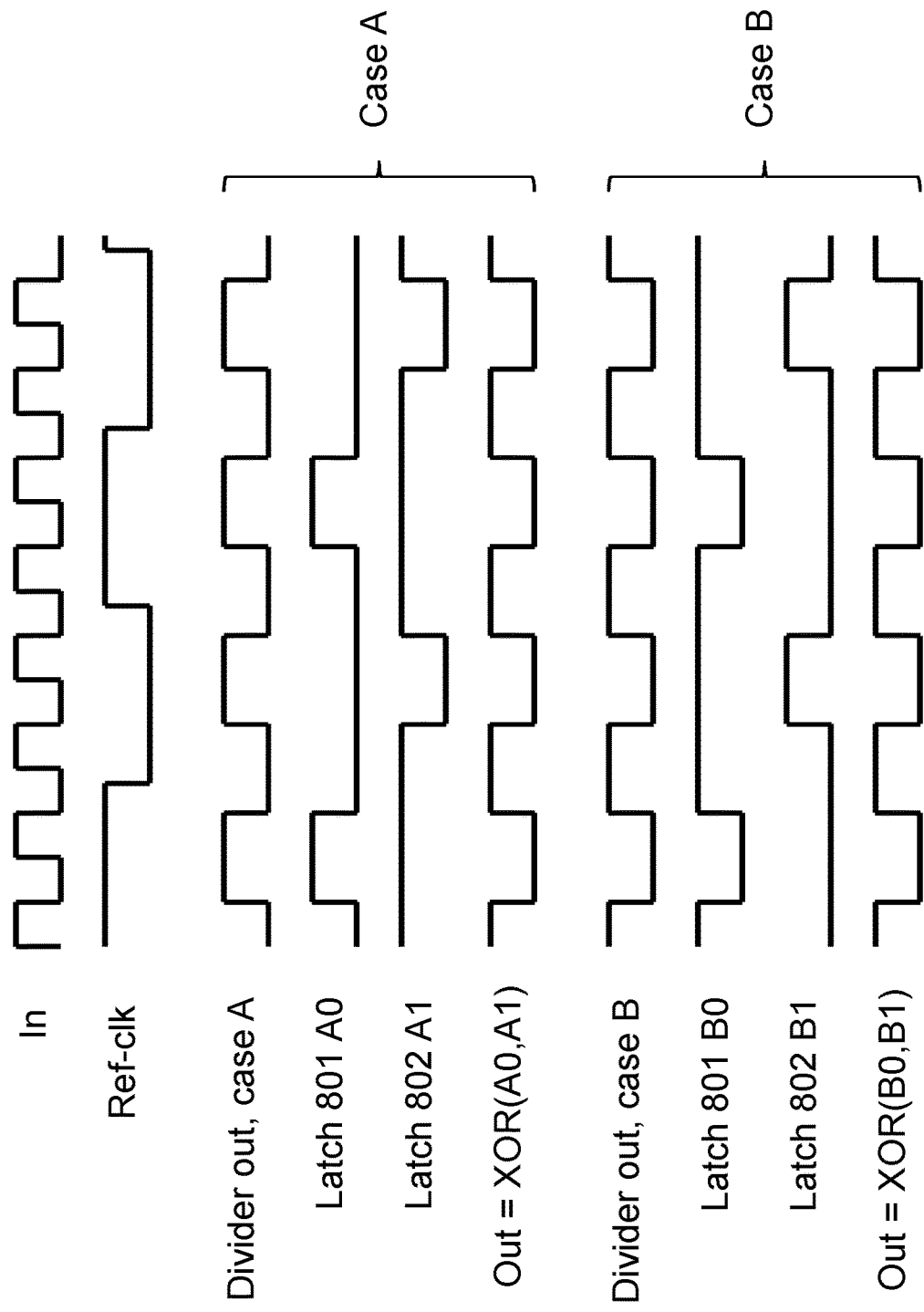
FIGS. 9a and 9b are diagrams illustrating the responses of the clock signal polarity controlling circuit in FIG. 8 for different reference clock frequencies.
Figure 9B:
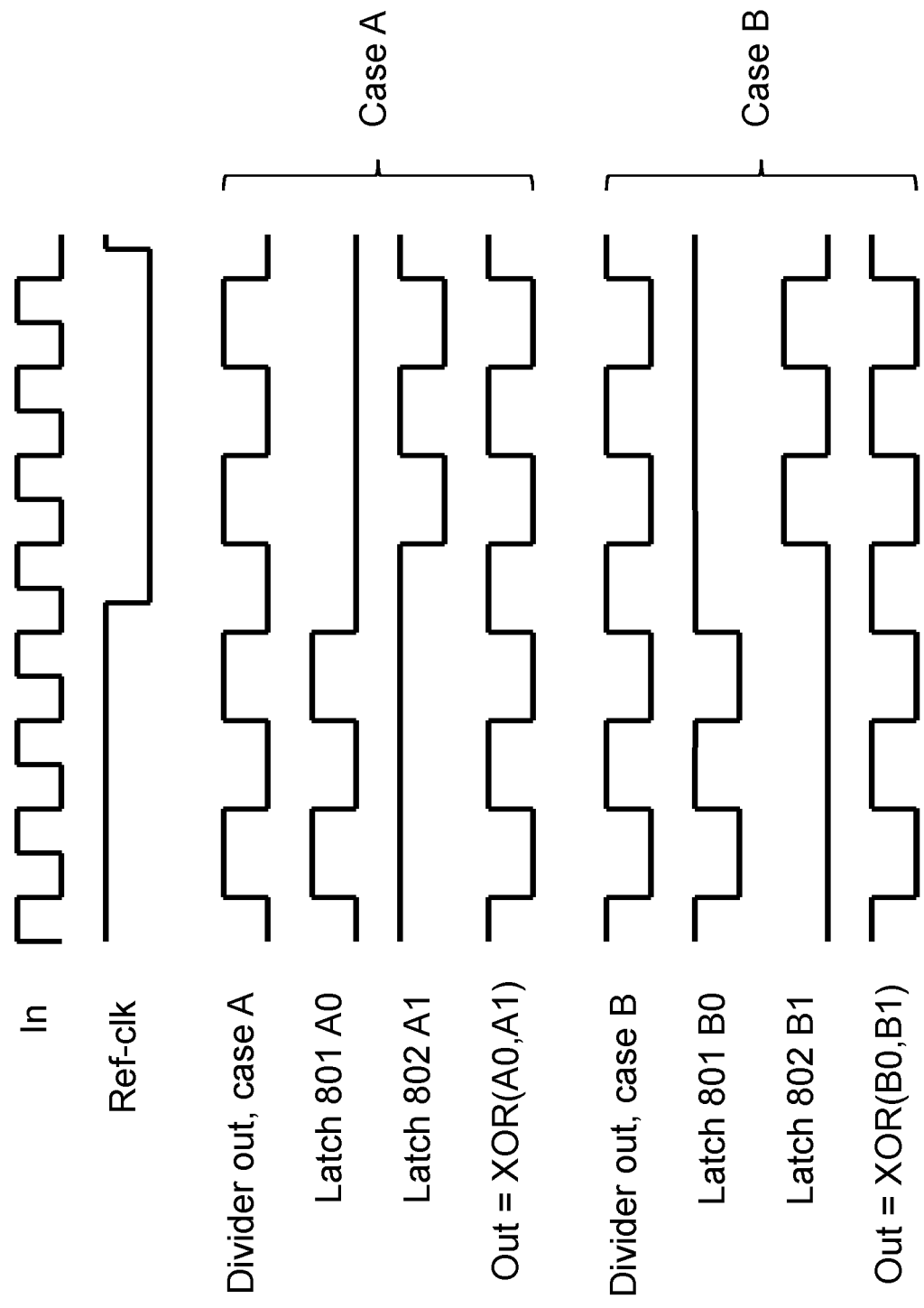

According to embodiments herein, a frequency of the reference clock signal Ref-clk may be half of or lower than the frequency of the clock signal from the clock signal generator 810, e.g. ½, ¼, ⅛ etc. or generally may be $1/(2^n)$, where $n \geq 1$. FIGS. 9a and 9b show responses of the clock signal polarity controlling circuit 800 in FIG. 8 for different reference clock signal frequencies with different scenarios, where in FIG. 9a, the frequency of the reference clock signal Ref-clk is half of the divide by 2 circuit output signal frequency, and in FIG. 9b, the frequency of the reference clock signal Ref-clk is a quarter of the divide by 2 circuit output signal frequency.

In both FIGS. 9a and 9b, for case A, where the clock signal, indicated by "Divider out, case A", is out-of-phase with the reference clock signal "Ref-clk", the output from the first latch 801 is indicated by "Latch 801 A0", the output from the second latch 802 is indicated by "Latch 802 A1". An XOR operation on the outputs from the first and second latches 801, 802 will give an output clock signal having a polarity controlled by the reference clock signal Ref-clk, indicated by "Out=XOR(A0,A1)", i.e. the output clock signal is in-phase with the reference clock signal "Ref-clk" or has the same polarity with respect to the reference clock signal. In this case, the polarity of the clock signal is inverted.

For case B, where the clock signal, indicated by "Divider out, case B", is in-phase with the reference clock signal "Ref-clk", the output from the first latch 801 is shown by "Latch 801 B0", the output from the second latch 802 is shown by "Latch 802 B1". An XOR operation on the outputs of the first and second latches 801, 802 will give an output clock signal having a polarity controlled by the reference clock signal Ref-clk, shown by "Out=XOR(B0, B1)", i.e.

the output clock signal is in-phase with the reference clock signal "Ref-clk" or has the same polarity with respect to the reference clock signal. In this case, the polarity of the clock signal is as it is.

Therefore, according to some embodiments herein, a clock signal having the same polarity with respect to the reference clock signal, or with the same logic level as the reference clock signal at sampling instants, may be generated at the output of the XOR circuit.

Figure 10:
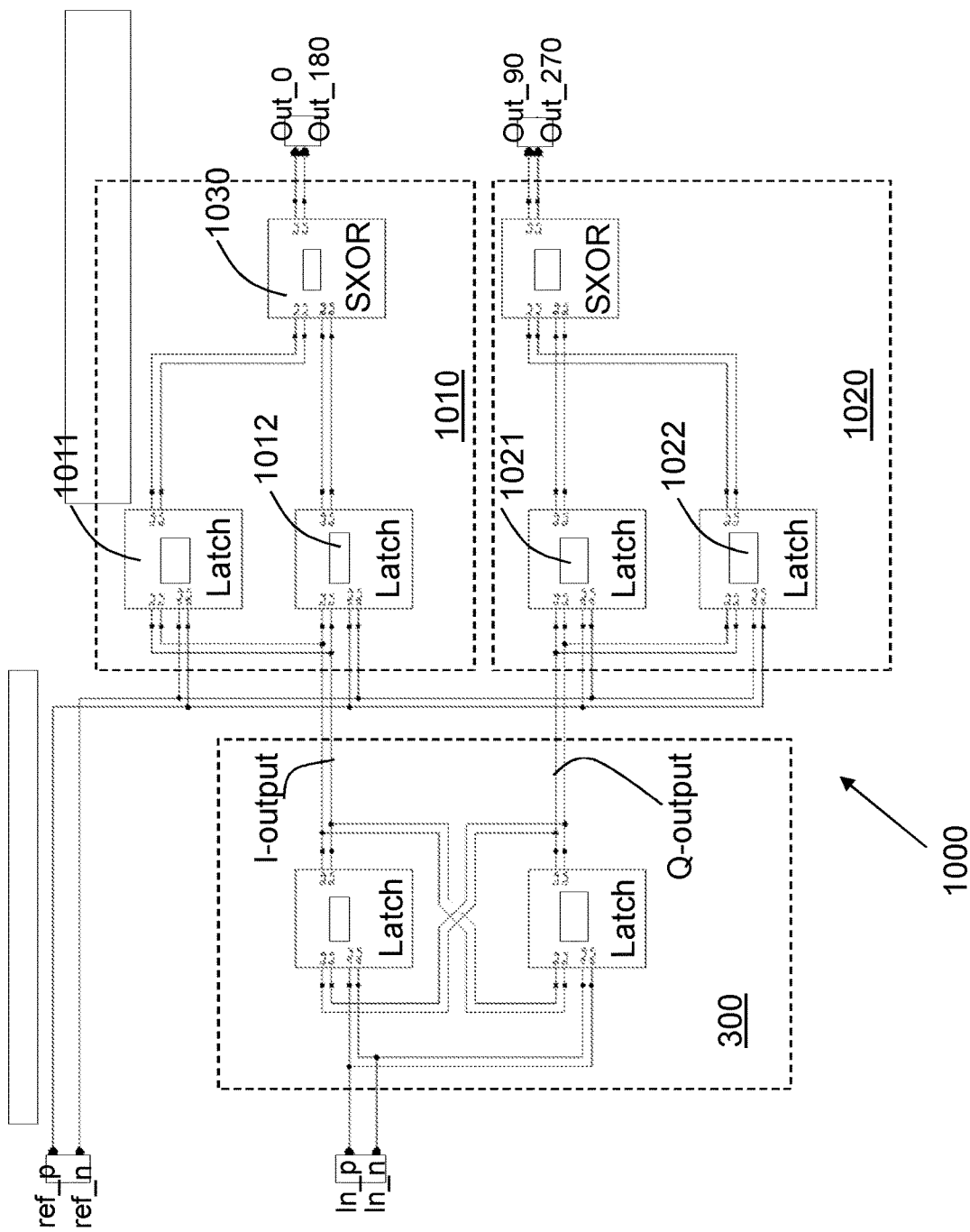
FIG. 10 is a block diagram illustrating a differential IQ clock signal generating circuit according to embodiments herein.

FIG. 10 shows a quadrature differential clock signal generating circuit 1000. The quadrature differential clock signal generating circuit 1000 comprises a quadrature clock signal generator 300. The quadrature clock signal generator 300 has an I-output and a Q-output, both are differential. The quadrature differential clock signal generating circuit 1000 further comprises two clock signal polarity controlling circuits 1010, 1020. The two clock signal polarity controlling circuits 1010, 1020 are coupled to I- and Q-outputs respectively. The two clock signal polarity controlling circuits 1010, 1020 have the same structure as the clock signal polarity controlling circuit 800 shown in FIG. 8, i.e. the two latches 1011/1012, 1021/1022 in the first and second clock signal polarity controlling circuits 1010/1020 are connected in parallel with the clock and data inputs inverted on one of them. However the first and second latches in the clock signal polarity controlling circuit 1010/1020 are differential latches, and the XOR is a symmetrical XOR, SXOR 1030, with differential inputs and differential outputs.

Figure 11:
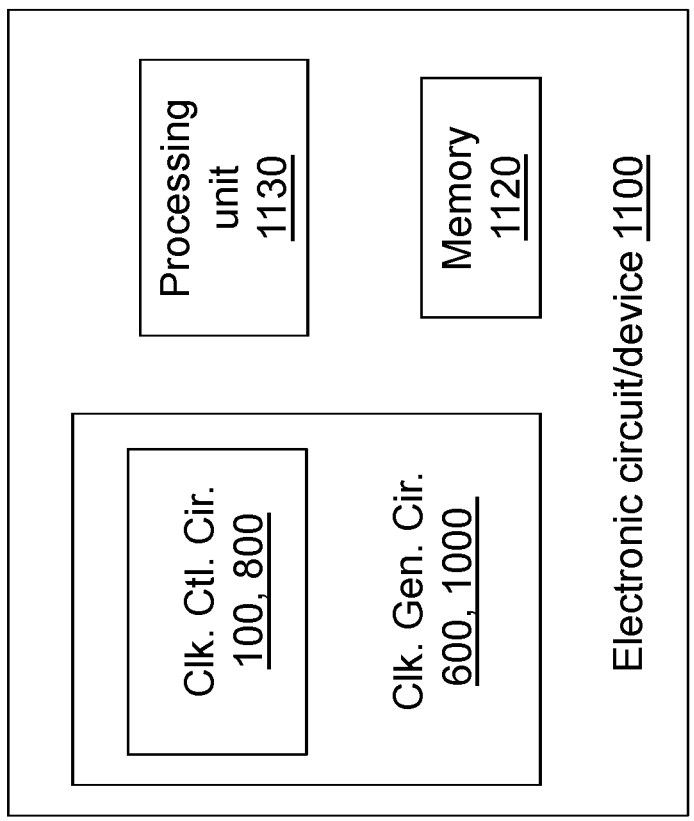
FIG. 11 is a block diagram illustrating an electronic circuit or device in which embodiments herein may be implemented.

The technique for controlling a clock signal polarity according to embodiments herein is suitable for any electronic circuit or device where a clock signal is needed and generated. FIG. 11 shows an electronic circuit or device 1100 in which the clock signal polarity controlling circuit 100, 800 and the quadrature clock signal generating circuit 600, 1000 according to embodiments herein may be implemented. The electronic circuit or device 1100 may be any one of an electronic circuit, such as a transceiver, a transmitter, a receiver, a frequency synthesiser, a mixer etc. The electronic circuit or device 1100 may also be any one of a communication device, such as a base station or beamforming base station, a mobile terminal or a user equipment for a cellular communications system or in a wireless communication system, then the electronic circuit or device 1100 may comprise other units, e.g. a memory 1120 and a processing unit 1130 for information storage and signal processing etc.

When using the word "comprise" or "comprising" it shall be interpreted as non-limiting, i.e. meaning "consist at least of".

The embodiments herein are not limited to the above described preferred embodiments. Various alternatives, modifications and equivalents may be used. Therefore, the above embodiments should not be taken as limiting the scope of the invention, which is defined by the appended claims.

The invention claimed is:

1. A clock signal polarity controlling circuit comprising:
a first latch comprising a clock input, a data input and an output, wherein the data input of the first latch is coupled to an output of a clock signal generator and the clock input of the first latch is coupled to a reference clock signal;
a second latch comprising a clock input, a data input and an output, wherein the data input of the second latch is coupled to the output of the first latch and the clock input of the second latch is coupled to an inverted of the reference clock signal; and
an XOR circuit comprising a first and second inputs and an output, wherein the first and second inputs of the XOR circuit are coupled to the output of the second latch and the output of the clock signal generator respectively, wherein a clock signal having a polarity that is controlled by the reference clock signal is generated at the output of the XOR circuit, wherein a frequency of the reference clock signal is half, or less than half, of a frequency of the clock signal, and wherein the XOR circuit is a local oscillator driver having an input port for inverting output signal polarity of the XOR circuit.

2. The clock signal polarity controlling circuit according to claim 1, wherein the clock signal with an opposite logic level as the reference clock signal at sampling instants is generated at the output of the XOR circuit.

3. The clock signal polarity controlling circuit according to claim 1, wherein the clock signal polarity controlling circuit is implemented in an electronic circuit to control clock signal polarity of a clock signal used by the electronic circuit.

4. The clock signal polarity controlling circuit according to claim 1, wherein the clock signal polarity controlling circuit is differential, and the first and second latches are differential latches connected in a flip-flop configuration.

5. A quadrature clock signal generating circuit comprising:
a quadrature clock signal generator having an In-phase (I)-output and a Quadrature (Q)-output; and
a clock signal polarity controlling circuit to receive the I-output and Q-output from the quadrature clock signal generator, the clock signal polarity controlling circuit comprising:
a first latch comprising a clock input, a data input and an output, wherein the data input of the first latch is coupled to one of the I-output or Q-output of the quadrature clock signal generator and the clock input of the first latch is coupled to a reference clock signal;
a second latch comprising a clock input, a data input and an output, wherein the data input of the second latch is coupled to the output of the first latch and the clock input of the second latch is coupled to an inverted of the reference clock signal;
a comparator to convert a differential output of the second latch to provide a single ended low pass filtered signal; and
an XOR circuit comprising a first and second inputs and an output, wherein the first and second inputs of the XOR circuit are coupled to the comparator to receive the single ended low pass filtered signal and the one of the I-output or Q-output of the quadrature clock signal generator respectively, wherein a clock signal having a polarity that is controlled by the reference clock signal is generated at the output of the XOR circuit, and wherein a frequency of the reference clock signal is half, or less than half, of a frequency of the clock signal.

6. The quadrature clock signal generating circuit according to claim 5, further comprising a dummy load coupled to the other of the I-output or Q-output from the quadrature clock signal generator.

7. The quadrature clock signal generating circuit according to claim 5, further comprising a buffer, wherein the clock inputs of the first and second latches are coupled to the reference clock signal through the buffer.

8. The quadrature clock signal generating circuit according to claim 5, wherein the single ended low pass filtered signal is used for indicating, controlling, or indicating and controlling, the polarity of the clock signal.

9. The quadrature clock signal generating circuit according to claim 5 wherein the output of the second latch in the clock signal polarity controlling circuit is used to invert the polarity of the clock signal at the output of the XOR circuit.

10. The quadrature clock signal generating circuit according to claim 5, wherein the quadrature clock signal generating circuit is implemented in an electronic circuit to control clock signal polarity of a clock signal used by the electronic circuit.

11. A clock signal polarity controlling circuit comprising:
a first latch comprising a clock input, a data input and an output, wherein the data input of the first latch is coupled to an output of a clock signal generator and the clock input is coupled to a reference clock signal;
a second latch comprising a clock input, a data input and an output, wherein the data input of the second latch is coupled to an inverted output of the clock signal generator and the clock input of the second latch is coupled to an inverted reference clock signal; and
an XOR circuit comprising a first and second inputs and an output, wherein the first and second inputs of the XOR circuit are coupled to the outputs of the first and second latches respectively, wherein a clock signal having a polarity that is controlled by the reference clock signal is generated at the output of the XOR circuit, and wherein a frequency of the reference clock signal is half, or less than half, of a frequency of the clock signal.

12. The clock signal polarity controlling circuit according to claim 11, wherein the clock signal with the same logic level as the reference clock signal at sampling instants is generated at the output of the XOR circuit.

13. The clock signal polarity controlling circuit according to claim 11, wherein the first and second latches in the clock signal polarity controlling circuit are differential latches, and the XOR circuit is a symmetrical XOR circuit with differential inputs and differential outputs.

14. A quadrature clock signal generating circuit comprising;
a quadrature clock signal generator having an In-phase (I)-output and a Quadrature (Q)-output; and
a first clock signal polarity controlling circuit comprising:
a first latch comprising a clock input, a data input and an output, wherein the data input of the first latch is coupled to the I-output of the quadrature clock signal generator and the clock input is coupled to a reference clock signal;
a second latch comprising a clock input, a data input and an output, wherein the data input of the second latch is coupled to an inverted I-output of the quadrature clock signal generator and the clock input of the second latch is coupled to an inverted reference clock signal; and
an XOR circuit comprising a first and second inputs and an output, wherein the first and second inputs of the XOR circuit are coupled to the outputs of the first and second latches respectively, wherein an I-clock signal having a polarity that is controlled by the reference clock signal is generated at the output of the XOR circuit, and wherein a frequency of the reference clock signal is half, or less than half, of a frequency of the I-clock signal.

15. The quadrature clock signal generating circuit according to claim 14 further comprising a second clock signal polarity controlling circuit comprising:
a third latch comprising a clock input, a data input and an output, wherein the data input of the third latch is coupled to the Q-output of the quadrature clock signal generator and the clock input is coupled to the reference clock signal;
a fourth latch comprising a clock input, a data input and an output, wherein the data input of the fourth latch is coupled to an inverted Q-output of the quadrature clock signal generator and the clock input of the second latch is coupled to an inverted reference clock signal; and
a second XOR circuit comprising a first and second inputs and an output, wherein the first and second inputs of the second XOR circuit are coupled to the outputs of the third and fourth latches respectively, wherein a Q-clock signal having a polarity that is controlled by the reference clock signal is generated at the output of the second XOR circuit, and wherein the frequency of the reference clock signal is half, or less than half, of a frequency of the Q-clock signal.

16. The quadrature clock signal generating circuit according to claim 15, wherein the first, second, third and fourth latches are differential latches and the two XOR circuits have differential inputs and differential outputs.

* * * * *